United States Patent
Kim et al.

(10) Patent No.: US 9,305,928 B2
(45) Date of Patent: Apr. 5, 2016

(54) SEMICONDUCTOR DEVICES HAVING A SILICON-GERMANIUM CHANNEL LAYER AND METHODS OF FORMING THE SAME

(71) Applicant: Samsung Electronics Co., Ltd., Suwon-si (KR)

(72) Inventors: Youngkuk Kim, Seoul (KR); Ho-Kyun An, Seoul (KR); Jaehyun Yeo, Bucheon-si (KR); Badro Im, Yongin-si (KR); HanJin Lim, Seoul (KR); Sungho Jang, Seoul (KR); Insang Jeon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 168 days.

(21) Appl. No.: 14/175,076

(22) Filed: Feb. 7, 2014

(65) Prior Publication Data

US 2014/0264517 A1    Sep. 18, 2014

(30) Foreign Application Priority Data

Mar. 15, 2013    (KR) .......................... 10-2013-0028060

(51) Int. Cl.
*H01L 21/8242*    (2006.01)
*H01L 27/108*    (2006.01)
*H01L 21/8234*    (2006.01)

(52) U.S. Cl.
CPC .. *H01L 27/10894* (2013.01); *H01L 21/823412* (2013.01); *H01L 21/823462* (2013.01); *H01L 27/10814* (2013.01); *H01L 27/10861* (2013.01)

(58) Field of Classification Search
USPC .................................. 438/154, 239, 275, 287
See application file for complete search history.

(56) References Cited

U.S. PATENT DOCUMENTS

| | | | |
|---|---|---|---|
| 6,833,308 B2 | 12/2004 | Ahn et al. | |
| 7,718,496 B2 | 5/2010 | Frank et al. | |
| 7,932,143 B1 | 4/2011 | Pal et al. | |
| 8,017,469 B2 | 9/2011 | Luo et al. | |
| 8,217,463 B2 | 7/2012 | Pal et al. | |
| 8,440,547 B2 | 5/2013 | Bedell et al. | |
| 2005/0124121 A1* | 6/2005 | Rotondaro | C23C 16/56 438/287 |
| 2008/0079086 A1 | 4/2008 | Jung et al. | |
| 2009/0108373 A1* | 4/2009 | Frank | H01L 27/11 257/392 |
| 2010/0065918 A1 | 3/2010 | Ikeno et al. | |

(Continued)

FOREIGN PATENT DOCUMENTS

| | | |
|---|---|---|
| KR | 1020010028838 | 4/2001 |
| KR | 1020030002260 | 1/2003 |

(Continued)

*Primary Examiner* — Errol Fernandes
(74) *Attorney, Agent, or Firm* — Myers Bigel & Sibley, P.A.

(57) ABSTRACT

Semiconductor devices having a silicon-germanium channel layer and methods of forming the semiconductor devices are provided. The methods may include forming a silicon-germanium channel layer on a substrate in a peripheral circuit region and sequentially forming a first insulating layer and a second insulating layer on the silicon-germanium channel layer. The methods may also include forming a conductive layer on the substrate, which includes a cell array region and the peripheral circuit region, and patterning the conductive layer to form a conductive line in the cell array region and a gate electrode in the peripheral circuit region. The first insulating layer may be formed at a first temperature and the second insulating layer may be formed at a second temperature higher than the first temperature.

20 Claims, 14 Drawing Sheets

(56) References Cited

U.S. PATENT DOCUMENTS

| | | |
|---|---|---|
| 2010/0184260 A1* | 7/2010 | Luo ................ H01L 21/823807 438/154 |
| 2011/0272736 A1 | 11/2011 | Lee et al. |
| 2012/0153401 A1 | 6/2012 | Javorka et al. |
| 2012/0161249 A1 | 6/2012 | Kronholz et al. |

FOREIGN PATENT DOCUMENTS

| | | |
|---|---|---|
| KR | 1020070115145 | 12/2007 |
| KR | 1020110087457 | 8/2011 |

* cited by examiner

SEMICONDUCTOR DEVICES HAVING A SILICON-GERMANIUM CHANNEL LAYER AND METHODS OF FORMING THE SAME

CROSS-REFERENCE TO RELATED APPLICATION

This U.S. non-provisional patent application claims priority under 35 U.S.C. §119 to Korean Patent Application No. 10-2013-0028060, filed on Mar. 15, 2013, in the Korean Intellectual Property Office, the disclosure of which is hereby incorporated by reference in its entirety.

FIELD

The present disclosure generally relates to the field of electronics and, more particularly, to semiconductor devices.

BACKGROUND

Semiconductor devices have been widely used in the electronics industry and highly integrated semiconductor devices may be beneficial. Several fine patterning technologies may be used to manufacture highly integrated semiconductor devices but those technologies may raise manufacturing costs. Therefore, various technologies for manufacturing highly integrated semiconductor devices have been studied.

SUMMARY

A method of forming a semiconductor memory device may include forming a silicon-germanium channel layer on a substrate in a peripheral circuit region. The substrate may include a cell array region and the peripheral circuit region. The method may also include sequentially forming a first insulating layer and a second insulating layer on the silicon-germanium channel layer, forming a conductive layer on the substrate in the cell array region and the peripheral circuit region, and patterning the conductive layer to form a conductive line in the cell array region and a gate electrode in the peripheral circuit region. Sequentially forming the first and second insulating layers may include forming the first insulating layer at a first temperature and forming the second insulating layer at a second temperature higher than the first temperature.

In various embodiments, the first temperature may be lower than 750° C., and the second temperature may be higher than 750° C. The first insulating layer may have a first thickness thinner than a second thickness of the second insulating layer.

According to various embodiments, the peripheral circuit region may include a first peripheral circuit region and a second peripheral circuit region and the method may further include removing the first and second insulating layers from the second peripheral circuit region without removing the first and second insulating layers from the first peripheral circuit region and sequentially forming a third insulating layer and a fourth insulating layer on the substrate in the first and second peripheral circuit regions after removing the first and second insulating layers from the second peripheral circuit region without removing the first and second insulating layers from the first peripheral circuit region.

In various embodiments, sequentially forming the third and fourth insulating layers may include forming the third insulating layer at a third temperature and forming the fourth insulating layer at a fourth temperature higher than the third temperature. The fourth insulating layer may include a high-k dielectric layer having a dielectric constant greater than a dielectric constant of silicon oxide. The third insulating layer may have a third thickness thicker than a fourth thickness of the fourth insulating layer.

According to various embodiments, sequentially forming the first and second insulating layers may include forming the second insulating layer by increasing a temperature from the first temperature to the second temperature.

A semiconductor memory device may include a substrate including a cell array region and a peripheral circuit region, a bit line structure on the substrate in the cell array region, and a peripheral transistor including a silicon-germanium channel layer, a peripheral gate insulating layer, and a peripheral gate electrode sequentially stacked on the substrate in the peripheral circuit region. The bit line structure and the peripheral gate electrode may include a conductive layer. The peripheral gate insulating layer may include a low-temperature insulating layer and a high-temperature insulating layer between the low-temperature insulating layer and the peripheral gate electrode.

In various embodiments, the low-temperature insulating layer may be in contact with the silicon-germanium channel layer, and the low-temperature insulating layer may have a thickness thinner than a thickness of the high-temperature insulating layer.

In various embodiments, the low-temperature insulating layer may include silicon oxide, and the high-temperature insulating layer may include a high-k dielectric layer having a dielectric constant greater than a dielectric constant of silicon oxide.

According to various embodiments, the low-temperature insulating layer may include a first low-temperature insulating layer, and the high-temperature insulating layer may include a first high-temperature insulating layer. The peripheral transistor may include a first peripheral transistor and a second peripheral transistor. Each of the first and second peripheral transistors may include the first low-temperature insulating layer and the first high-temperature insulating layer. The second peripheral transistor may further include a second low-temperature insulating layer between the first low-temperature insulating layer and the substrate and a second high-temperature insulating layer between the second low-temperature insulating layer and the first low-temperature insulating layer.

In various embodiments, the first low-temperature insulating layer may have a first thickness thicker than a second thickness of the first high-temperature insulating layer, and the second low-temperature insulating layer may have a third thickness thinner than a fourth thickness of the second high-temperature insulating layer.

According to various embodiments, the semiconductor memory device may further include a word line structure buried in the substrate of the cell array region, a dopant region adjacent a side of the word line structure, and a capacitor electrically connected to the dopant region.

A semiconductor memory device may include a substrate including a cell array region, a first peripheral circuit region, and a second peripheral circuit region, a bit line structure on the substrate in the cell array region, a first peripheral transistor on the substrate in the first peripheral circuit region, and a second peripheral transistor on the substrate in the second peripheral circuit region. Each of the first and second peripheral transistors may include a silicon-germanium channel layer, a gate electrode on the silicon-germanium channel layer, and a gate insulating layer including a first low-temperature insulating layer and a first high-temperature insulating layer between the first low-temperature insulating layer and the gate electrode. The bit line structure and the gate electrode may include a conductive material. The second peripheral transistor may further include a second low-temperature insulating layer between the first low-temperature insulating layer and the silicon-germanium channel layer, and a second high-temperature insulating layer between the second low-temperature insulating layer and the first low-temperature insulating layer.

A method of forming a semiconductor device may include forming a silicon-germanium channel layer on a substrate in a peripheral circuit region. The substrate may include a cell array region and the peripheral circuit region. The method may also include sequentially forming a first insulating layer at a first temperature and a second insulating layer at a second temperature higher than the first temperature on the silicon-germanium channel layer. The first insulating layer may contact the silicon-germanium channel layer. The method may further include removing the first and second insulating layers from the cell array region, forming a conductive layer on the substrate in the cell array region and the peripheral circuit region after removing the first and second insulating layers from the cell array region, and forming a bit line in the cell array region and a gate electrode in the peripheral circuit region by patterning the conductive layer.

In various embodiments, the first temperature may be lower than 750° C., and the second temperature may be higher than 750° C. The first temperature may be in a range of about 400° C. to about 700° C.

According to various embodiments, the first insulating layer may include a silicon oxide layer, and the second insulating layer may include a high-k dielectric layer having a dielectric constant higher than a dielectric constant of silicon oxide.

According to various embodiments, the first insulating layer may have a first thickness thinner than a second thickness of the second insulating layer.

In various embodiments, the bit line may contact an upper surface of the substrate. The method may also include forming a buried word line structure in the cell array region before forming the silicon-germanium channel layer.

According to various embodiments, the peripheral circuit region may include a first peripheral circuit region and a second peripheral circuit region. The gate electrode may include a first gate electrode formed in the first peripheral circuit region. Additionally, the method may include removing the first and second insulating layers from the second peripheral circuit region at least partially concurrently with removing the first and second insulating layers from the cell array region, sequentially forming a third insulating layer and a fourth insulating layer in the first and second peripheral circuit regions after removing the first and second insulating layers from the second peripheral circuit region and before forming the conductive layer, and forming a second gate electrode in the second peripheral circuit region by patterning the conductive layer. Sequentially forming the third and fourth insulating layers may include forming the third insulating layer at a third temperature and forming the fourth insulating layer at a fourth temperature higher than the third temperature.

In various embodiments, the third temperature may be lower than 750° C., and the fourth temperature is higher than 750° C. The third insulating layer may have a third thickness thicker than a fourth thickness of the fourth insulating layer.

A method of forming a semiconductor device may include forming a silicon-germanium channel layer on a substrate in a first peripheral circuit region and a second peripheral circuit region. The substrate may include a cell array region and the first and second peripheral circuit regions. The method may also include sequentially forming a first insulating layer at a first temperature and a second insulating layer at a second temperature higher than the first temperature on the silicon-germanium channel layer. The first insulating layer may contact the silicon-germanium channel layer. The method may further include removing the first and second insulating layers from the cell array region and the second peripheral circuit region without removing the first and second insulating layers from the first peripheral circuit region, sequentially forming a third insulating layer and a fourth insulating layer on the silicon-germanium channel layer after removing the first and second insulating layers from the cell array region and the second peripheral circuit region without removing the first and second insulating layers from the first peripheral circuit region, forming a conductive layer on the substrate in the cell array region and the first and second peripheral circuit regions, and forming a bit line in the cell array region, and first and second gate electrodes in the first and second peripheral circuit regions, respectively, by patterning the conductive layer. Sequentially forming the third and fourth insulating layers may include forming the third insulating layer at a third temperature and forming the fourth insulating layer at a fourth temperature higher than the third temperature, and the third insulating layer formed in the second peripheral circuit region may contact the silicon-germanium channel layer.

In various embodiments, the first and third temperatures may be lower than 750° C., and the second and fourth temperatures may be higher than 750° C.

DETAILED DESCRIPTION

Figure 1:
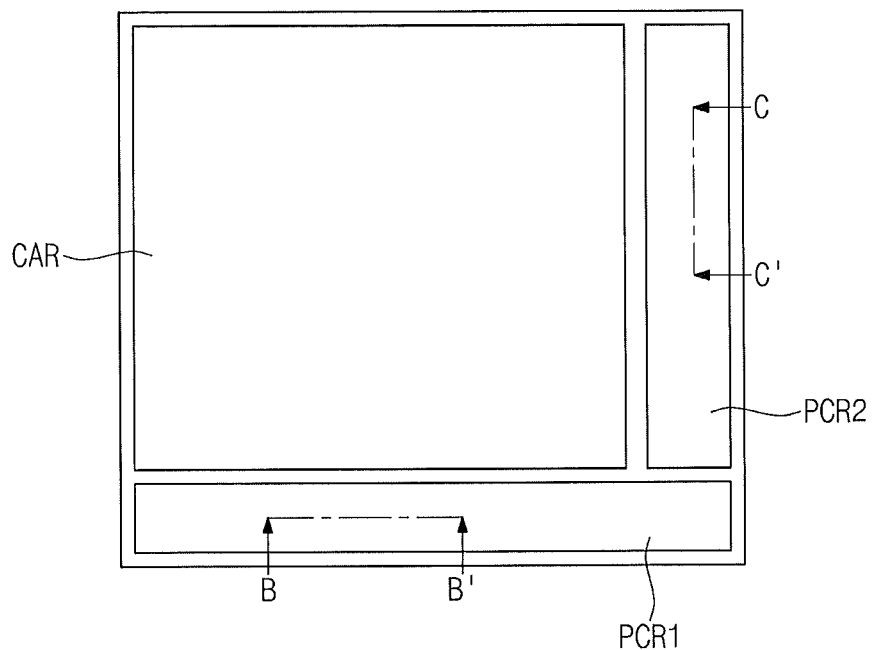
FIG. 1 is a plan view illustrating a semiconductor device according to some embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. As used herein, the term "and/or" includes any and all combinations of one or more of the associated listed items. It will be understood that when an element is referred to as being "coupled" or "connected" to, or "on" another element, it can be directly coupled or connected to, or on the other element, or intervening elements may also be present. In contrast, when an element is referred to as being "directly coupled," or "directly connected" to, or "directly on," another element, there are no intervening elements present.

It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof.

It will be also understood that although the terms first, second, third, etc. may be used herein to describe various elements, these elements should not be limited by these terms. These terms are only used to distinguish one element from another element. Thus, a first element in some embodiments could be termed a second element in some embodiments without departing from the teachings of this disclosure.

Moreover, example embodiments are described herein with reference to cross-sectional and/or plane view illustrations that are schematic illustrations of idealized embodiments and intermediate structures of example embodiments. Accordingly, variations from the shapes of the illustrations as a result, for example, of manufacturing techniques and/or tolerances, are to be expected. Thus, example embodiments should not be construed as limited to the particular shapes illustrated herein but include deviations in shapes that result, for example, from manufacturing. For example, an etching region illustrated as a rectangle may have rounded or curved features. Thus, the regions illustrated in the figures are schematic in nature and their shapes are not intended to illustrate the actual shape of a region of a device and are not intended to limit the scope of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
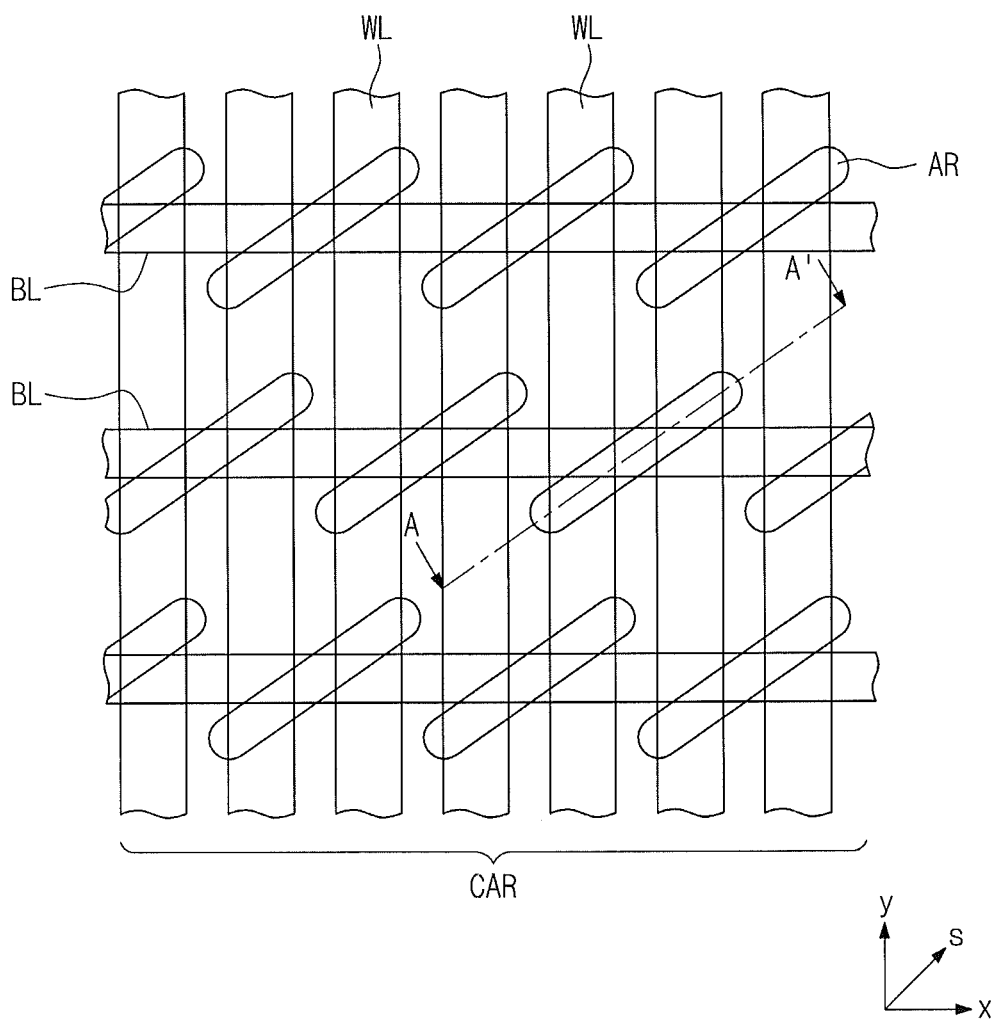
FIG. 2 is an enlarged view of the cell array region CAR illustrated in FIG. 1.
Figure 3A:
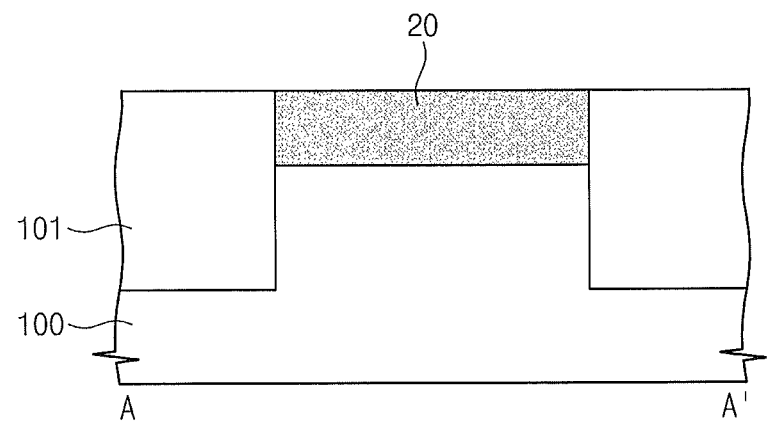
FIGS. 3A, 4A, 5A, 6A, 7A, 8A, and 9A are sectional views taken along the line A-A' of FIG. 2 illustrating a method of forming a semiconductor device according to some embodiments of the present inventive concepts.
Figure 3B:
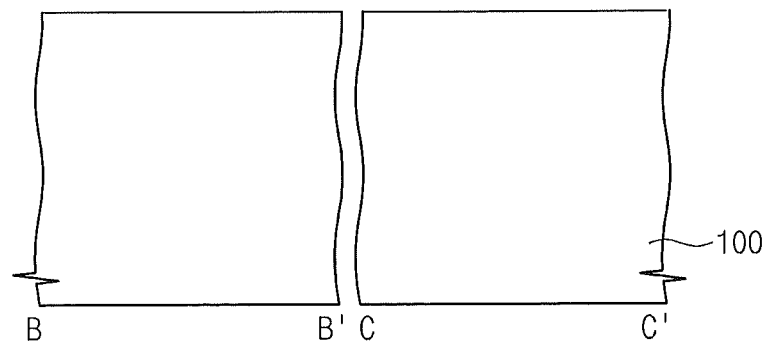
FIGS. 3B, 4B, 5B, 6B, 7B, 8B, and 9B are sectional views taken along the line B-B' and the line C-C' of FIG. 1 illustrating a method of forming a semiconductor device according to some embodiments of the present inventive concepts.
Figure 4A:
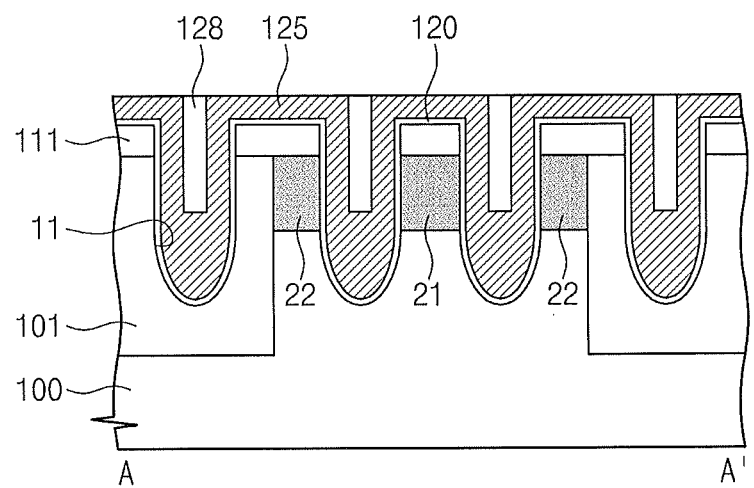
Figure 4B:
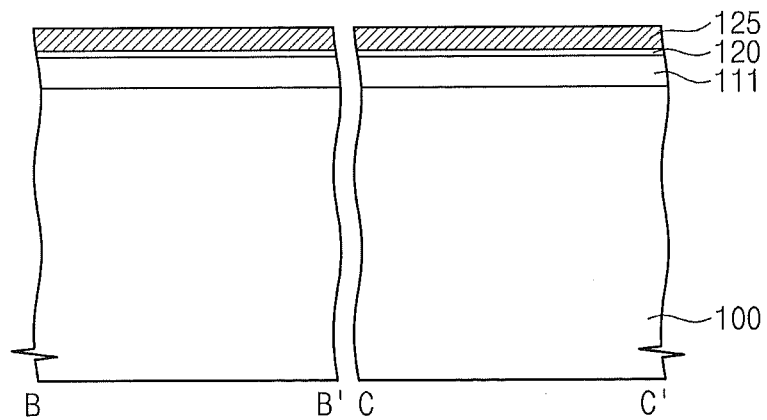
Figure 5A:
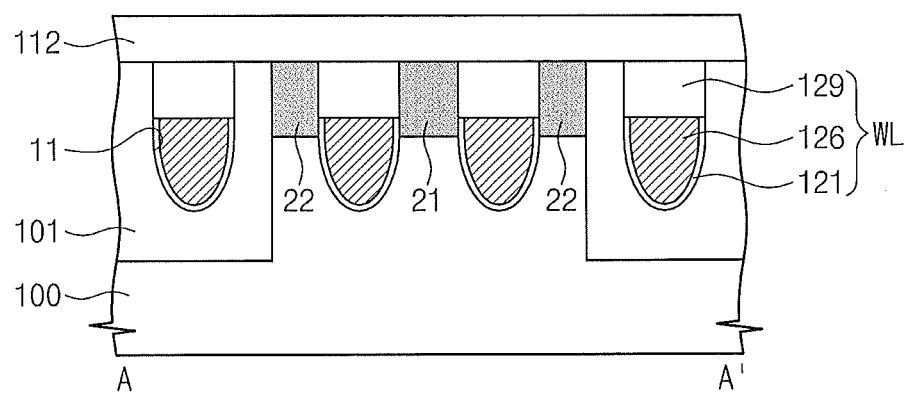
Figure 5B:
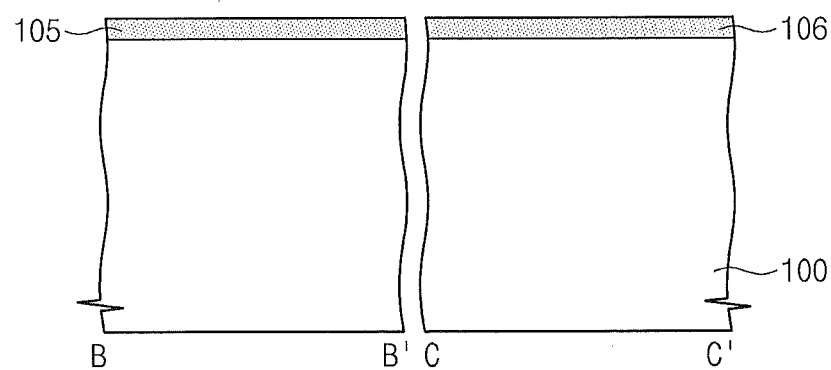
Figure 6A:
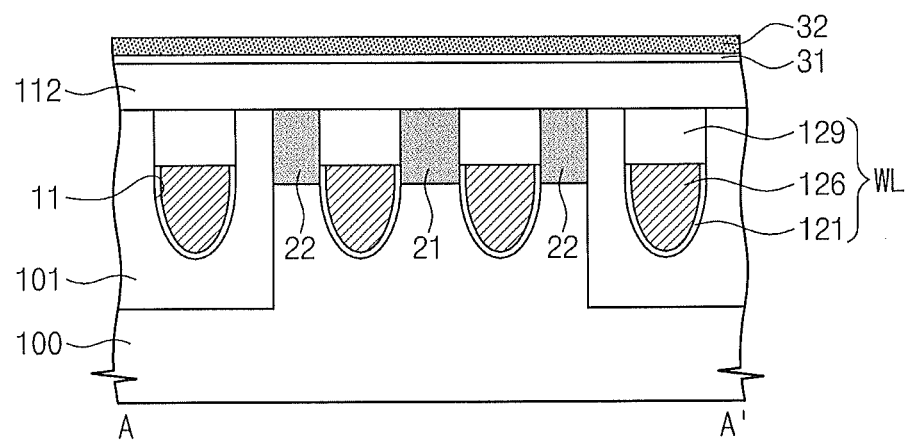
Figure 6B:
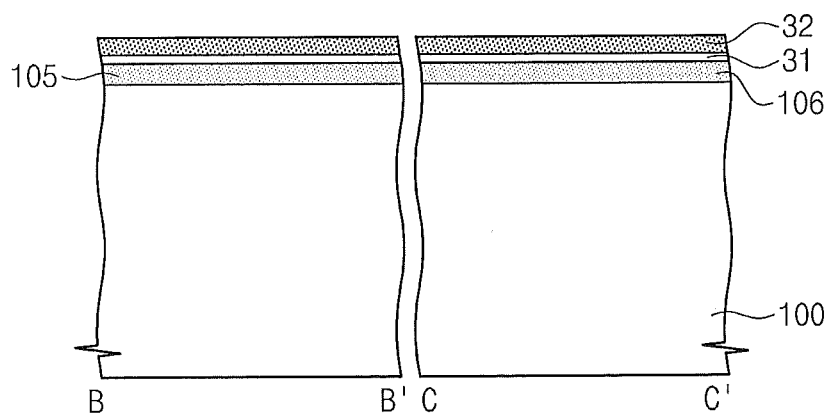
Figure 7A:
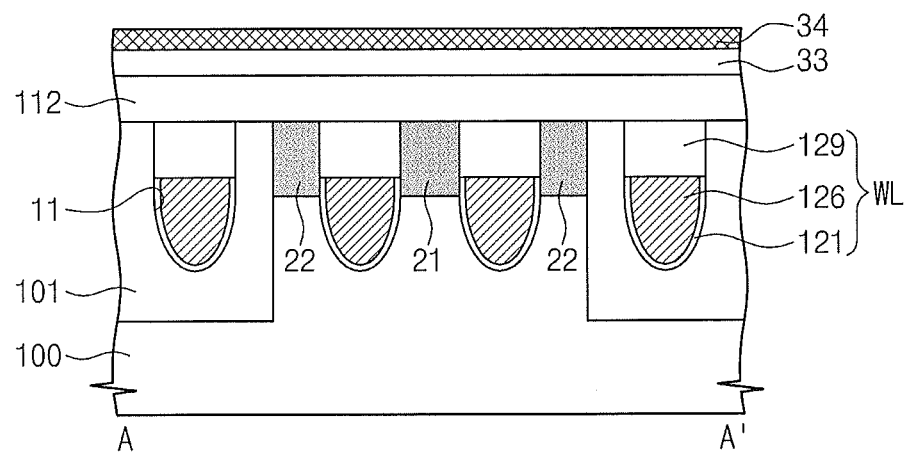
Figure 7B:
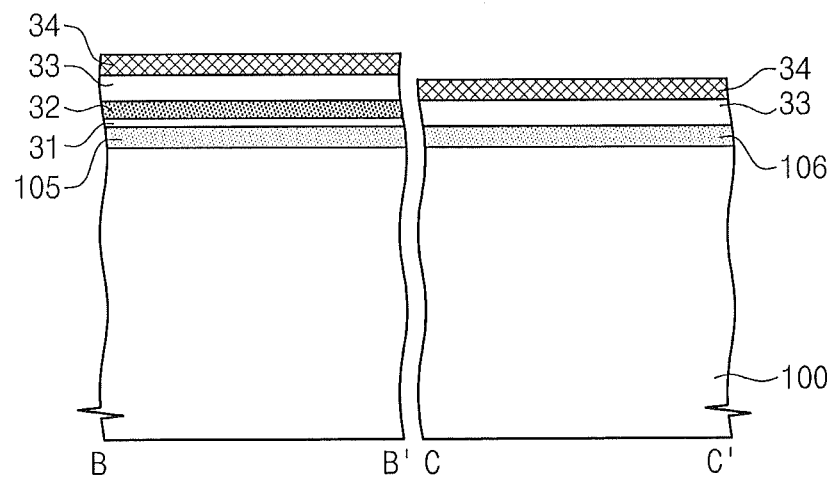
Figure 8A:
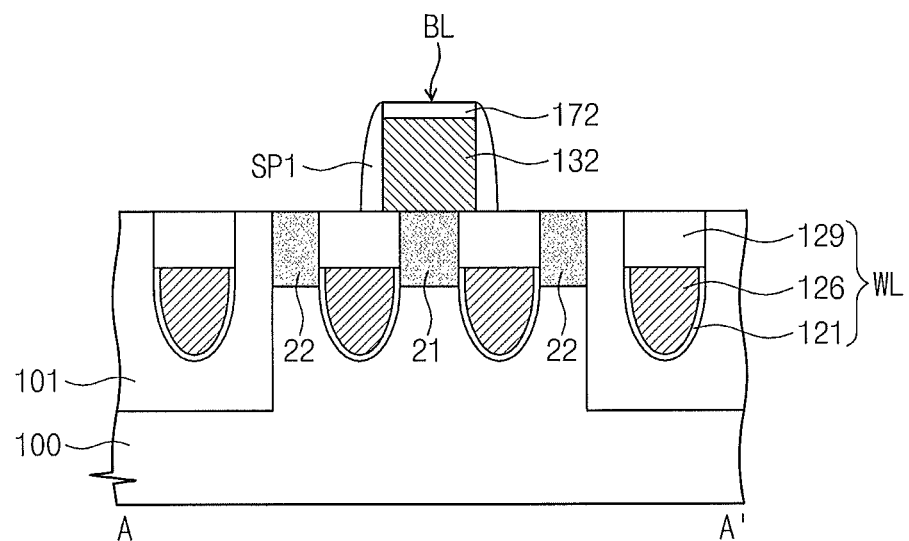
Figure 8B:
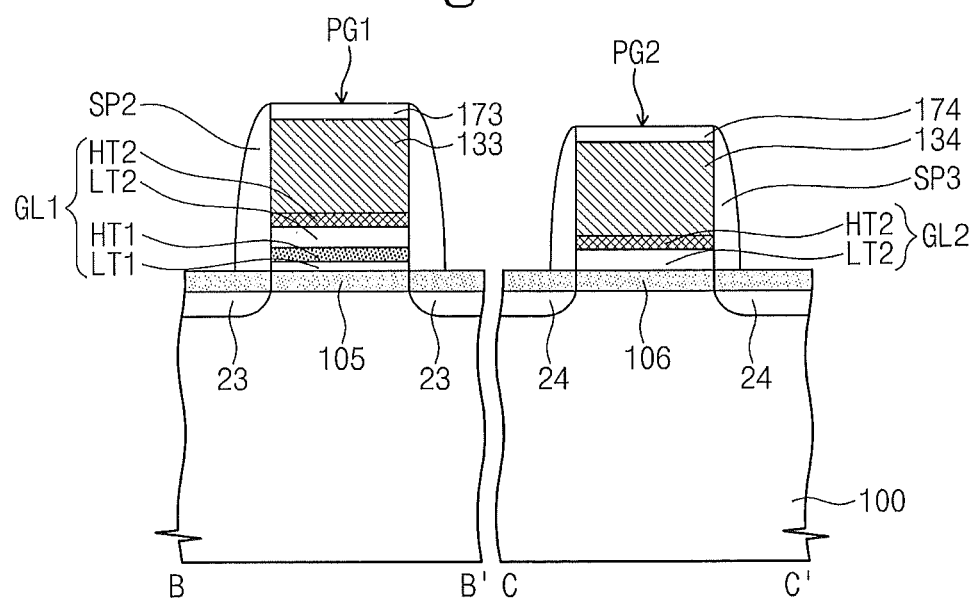
Figure 9A:
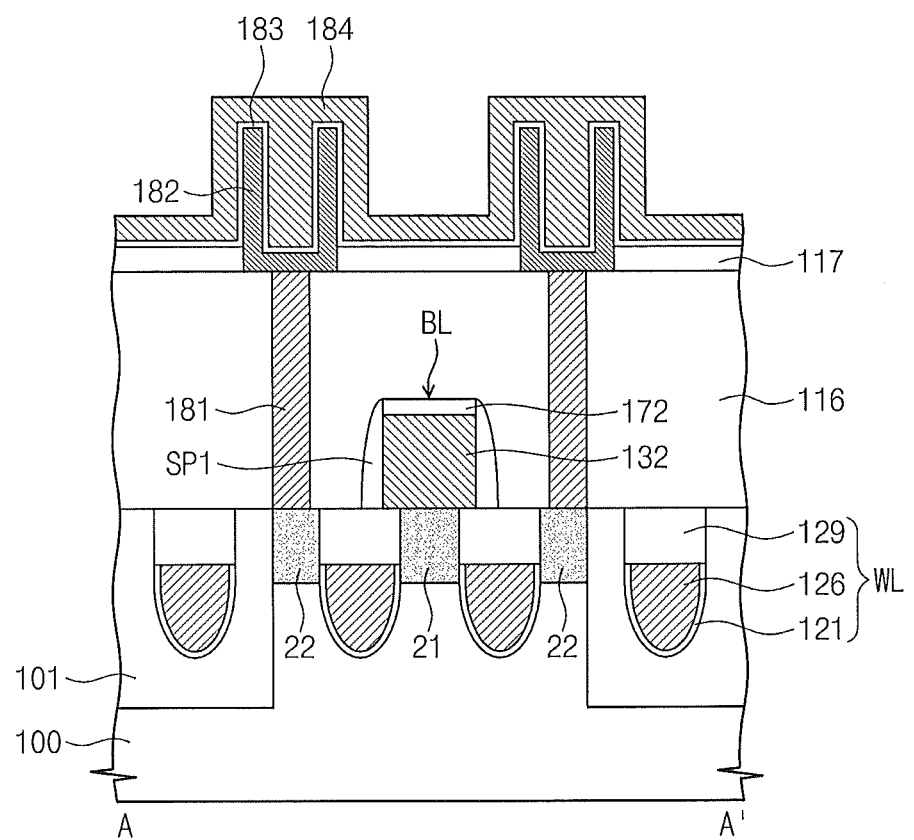
Figure 9B:
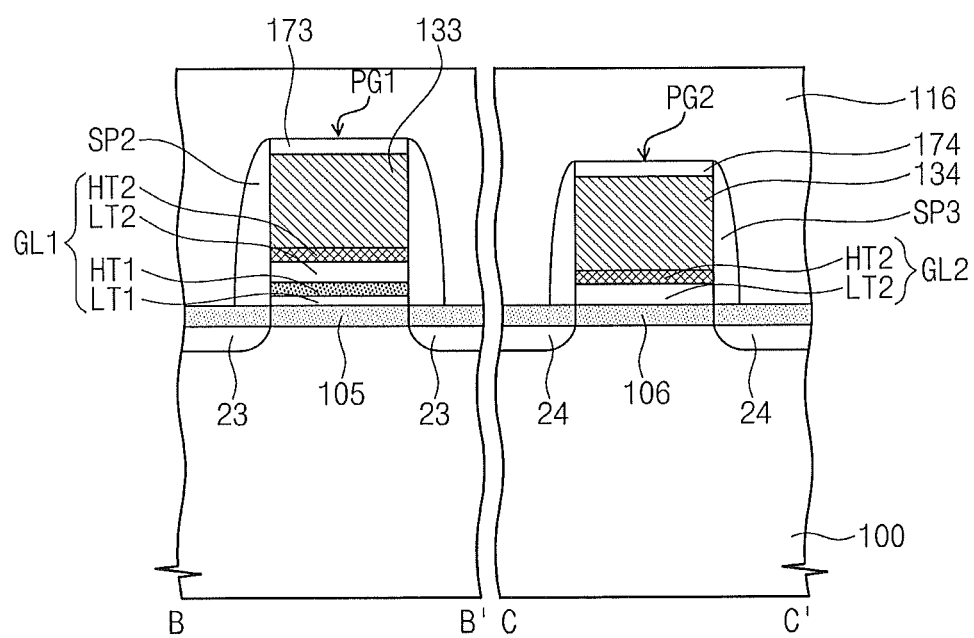

FIG. 1 is a plan view illustrating a semiconductor device according to some embodiments of the present inventive concepts. FIG. 2 is an enlarged view of the cell array region CAR illustrated in FIG. 1. FIGS. 3A, 4A, 5A, 6A, 7A, 8A, and 9A are sectional views taken along the line A-A' of FIG. 2 illustrating a method of forming a semiconductor device according to some embodiments of the present inventive concepts. FIGS. 3B, 4B, 5B, 6B, 7B, 8B, and 9B are sectional views taken along the line B-B' and the line C-C' of FIG. 1 illustrating a method of forming a semiconductor device according to some embodiments of the present inventive concepts.

Referring to FIGS. 1, 2, 3A, and 3B, a substrate 100 including a cell array region CAR and a peripheral circuit region may be provided. The cell array region CAR may be a region in which memory cells are disposed. The peripheral circuit region may be a region in which a word line driver, a sense amplifier, row and column decoders, and control circuits are disposed. The peripheral circuit region may include a first peripheral circuit region PCR1 and a second peripheral circuit region PCR2. Transistors having different threshold voltages may be provided in the first peripheral circuit region PCR1 and the second peripheral circuit region PCR2, respectively. Hereinafter, for explanation purposes, a first transistor may be provided in the first peripheral circuit region PCR1 and a second transistor may be provided in the second peripheral circuit region PCR2. However, the present inventive concepts are not limited thereto. In some embodiments, the first and second transistors may be provided in the same region.

Device isolation layers 101 may be formed in the substrate 100 to define active regions AR in the cell array region CAR. In some embodiments, the substrate 100 may be a silicon substrate. The active regions AR may have bar-shapes laterally spaced apart from each other. Each of the active regions AR may extend in a direction not perpendicular to neither a first direction (hereinafter, an x-direction) nor a second direction (hereinafter, a y-direction). The x-direction and the y-direction may be substantially perpendicular to each other.

A dopant region 20 may be formed in an upper portion of each of the active regions AR. The dopant region 20 may be formed by implanting dopant ions of a conductivity type different from that of the substrate 100 into an upper portion of the substrate 100. In some embodiments, the dopant region 20 may be formed to be shallower than the device isolation layers 101. That is, a depth of the dopant region 20 may be less than a depth of the device isolation layer 101. The dopant region 20 may be formed after or before the formation of the device isolation layers 101. In some embodiments, the dopant region 20 may be formed after some subsequent steps are performed. The dopant region 20 may be selectively formed in the cell array region CAR. When the dopant region 20 is formed, the first and second peripheral circuit regions PCR1 and PCR2 may be covered by a mask such that the dopant region 20 may not be formed in the first and second peripheral circuit regions PCR1 and PCR2.

Referring to FIGS. 1, 2, 4A, and 4B, trenches 11 may be formed in the upper portion of the substrate 100 in the cell array region CAR. The trenches 11 may extend in the y-direction and may be spaced apart from each other in the x-direction. Thus, the dopant region 20 may be divided into a first dopant region 21 and second dopant regions 22 by the trenches 11. In other words, in each of the active regions AR, the first dopant region 21 may be provided between a pair of second dopant regions 22, and the first dopant region 21 and the second dopant regions 22 may be divided by the trenches 11.

A mask pattern 111 may be formed on the substrate 100, and then a dry and/or a wet etching process may be performed using the mask pattern 111 as an etch mask on the substrate 100 to form the trenches 11. For example, the mask pattern 111 may include at least one of a photoresist, a silicon nitride layer, and a silicon oxide layer. A depth of the trenches 11 may be less than the depth of the device isolation layers 101.

A cell gate insulating layer 120, a cell gate conductive layer 125, and a filling layer 128 may be sequentially formed on the substrate having the trenches 11. After the cell gate insulating layer 120 and the cell gate conductive layer 125 are formed in the trenches 11, the filling layer 128 may be formed to fill the trenches 11. The process of forming the filling layer 128 may include performing a planarization process after an insulating layer is formed on the conductive layer 125.

For example, the cell gate insulating layer 120 may include at least one of a silicon oxide layer, a silicon nitride layer, or a silicon oxynitride layer. The cell gate conductive layer 125 may include at least one of a doped semiconductor material, a conductive metal nitride, a metal, or a metal-semiconductor compound. The filling layer 128 may include at least one of a silicon oxide layer, a silicon nitride layer, or a silicon oxynitride layer. Each of the cell gate insulating layer 120, the cell gate conductive layer 125 and the filling layer 128 may be formed by at least one of a chemical vapor deposition (CVD) process, a physical vapor deposition (PVD) process, or an atomic layer deposition (ALD) process.

Referring to FIGS. 1, 2, 5A, and 5B, the cell gate insulating layer 120 and the cell gate conductive layer 125 may be etched to be confined in the trenches 11. By the etching process, the cell gate insulating layer 120 may be divided into cell gate insulating patterns 121 spaced apart from each other and the cell gate conductive layer 125 may be divided into cell gate electrodes 126 spaced apart from each other. The etching process may be performed until the filling layer 128 is removed. Thus, top portions of the cell gate insulating patterns 121 and top surfaces of the cell gate electrodes 126 may be formed to be lower than top ends of the trenches 11.

Gate capping patterns 129 may be formed on the cell gate electrodes 126, respectively. In more detail, an insulating layer may fill upper portions of the trenches 11 in which the cell gate electrodes 126 are formed, and then a planarization process may be performed on the insulating layer until a top surface of the substrate 100 is exposed, thereby forming the gate capping patterns 129. The gate capping patterns 129 may include at least one of a silicon nitride layer, a silicon oxide layer, or a silicon oxynitride layer. As the result of the formation of the gate capping patterns 129, cell gate structures may be formed in the trenches 11, respectively. Each of the cell gate structures may include the cell gate insulating pattern 121, the cell gate electrode 126, and the gate capping pattern 129, which are sequentially stacked in each of the trenches 11. The cell gate structures may be word lines WL of a semiconductor device.

The cell gate insulating layer 120 and the cell gate conductive layer 125 in the first and second peripheral circuit regions PCR1 and PCR2 may be removed together by the etching process. The mask pattern 111 in the first and second peripheral circuit regions PCR1 and PCR2 may be removed to expose the top surface of the substrate 100 in the first and second peripheral circuit regions PCR1 and PCR2. The mask pattern 111 may be removed by a dry and/or a wet etching process.

After the mask pattern 111 is removed, a first silicon-germanium channel layer 105 may be formed on the substrate 100 of the first peripheral circuit region PCR1 and a second silicon-germanium channel layer 106 may be formed on the substrate 100 of the second peripheral circuit region PCR2. The first and second silicon-germanium channel layers 105 and 106 may be formed concurrently by a selective epitaxial growth (SEG) process. For example, the first and second silicon-germanium channel layers 105 and 106 may be formed to have a thickness of about 80 Å to about 120 Å. A mask layer 112 may be formed on the substrate 100 in the cell array region CAR. The cell array region CAR may be covered by the mask layer 112, such that the first and second silicon-germanium channel layers 105 and 106 may not be formed in the cell array region CAR. For example, the mask layer 112 may include a silicon nitride layer or a silicon oxynitride layer.

Composition ratios of silicon and germanium of upper and lower portions of the first and second silicon-germanium channel layers 105 and 106 may be substantially constant. Alternatively, the composition ratios of silicon and germanium of upper and lower portions of the first and second silicon-germanium channel layers 105 and 106 may be different. In some embodiments, the germanium composition ratio of the upper portions of the first and second silicon-germanium channel layers 105 and 106 may be higher than the germanium composition ratio of the lower portions of the first and second silicon-germanium channel layers 105 and 106. The first and second silicon-germanium channel layers 105 and 106 may be formed on top surface of the substrate 100 or may be formed in a recess region formed by etching an upper portion of the substrate 100.

Referring to FIGS. 1, 2, 6A, and 6B, a first insulating layer 31 and a second insulating layer 32 may be sequentially formed on the substrate 100. The first insulating layer 31 in the cell array region CAR may be formed on the mask layer 112, and the first insulating layer 31 in the first and second peripheral circuit regions PCR1 and PCR2 may be formed on the first and second silicon-germanium channel layers 105 and 106.

Figure 11:
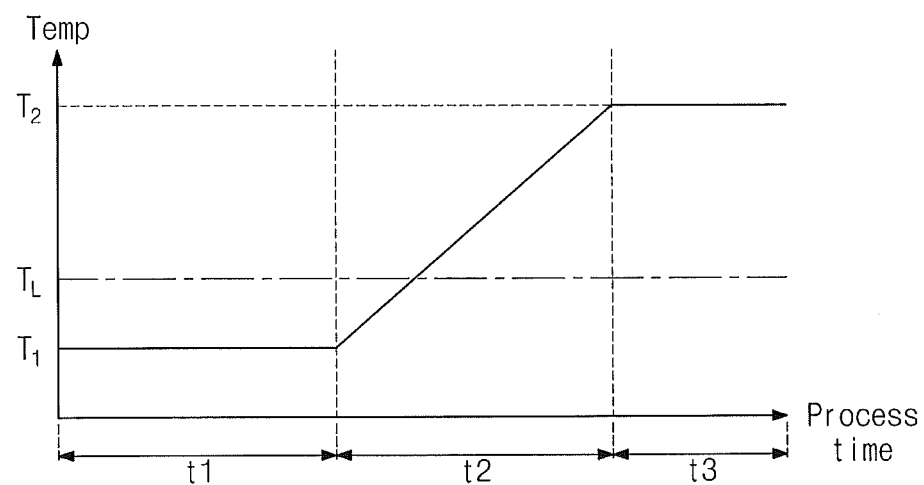
FIGS. 11 to 13 are graphs illustrating processes of forming insulating layers according to some embodiments of the present inventive concepts.
Figure 12:
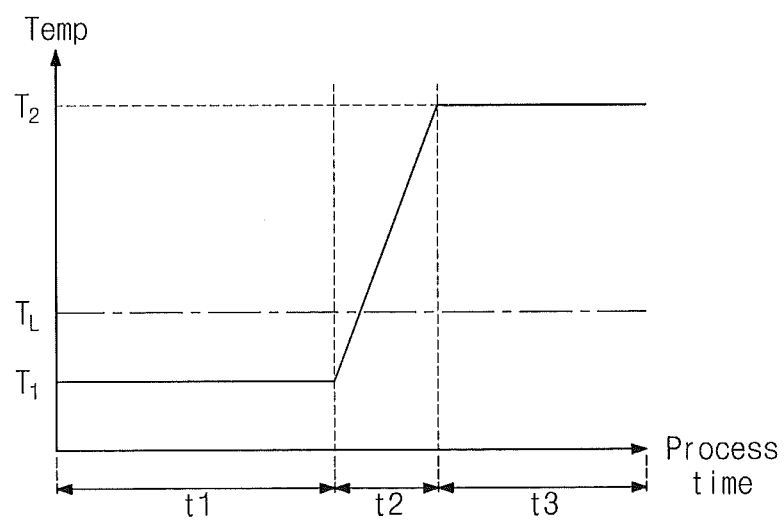
Figure 13:
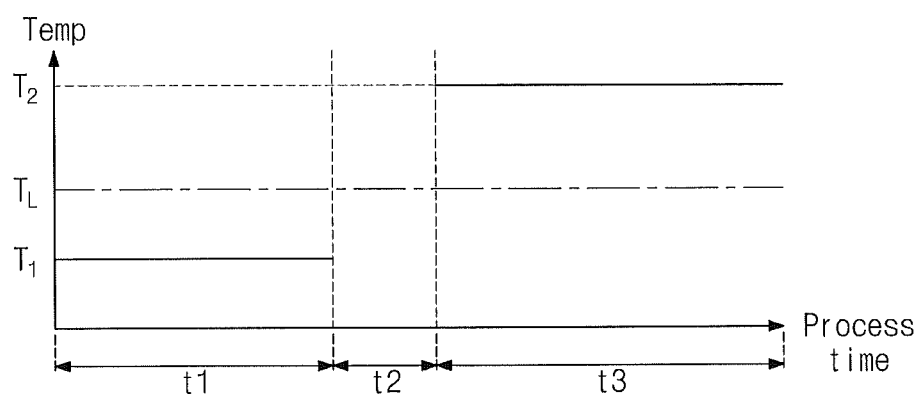

FIGS. 11 to 13 are graphs illustrating processes of forming insulating layers according to some embodiments of the present inventive concepts. Hereinafter, processes of forming the first and second insulating layers 31 and 32 will be described with reference to FIGS. 11 to 13 in more detail.

The first insulating layer 31 may be formed at a temperature lower than a formation temperature of the second insulating layer 32. In some embodiments, the first insulating layer 31 may be formed at a first temperature $T_1$ lower than a reference temperature $T_L$, and the second insulating layer 32 may be formed at a second temperature $T_2$ higher than the reference temperature $T_L$. The reference temperature $T_L$ may be the maximum temperature under which germanium atoms in the first and second silicon-germanium channel layers 105 and 106 remain stable. The reference temperature $T_L$ may be reduced as a germanium concentration of the first and second silicon-germanium channel layers 105 and 106 is increased. For example, the reference temperature $T_L$ may be about 750° C. For example, the first temperature $T_1$ may be in the range of about 400° C. to about 700° C., and the second temperature $T_2$ may be in the range of about 800° C. to about 1200° C.

A silicon-germanium layer may have carrier mobility higher than that of a silicon layer. However, thermal stability of the silicon-germanium layer may be lower than that of the silicon layer. For example, the silicon-germanium layer has a melting point (about 937° C. to about 1415° C.) lower than that of the silicon layer according to its germanium concentration. Thus, if a gate insulating layer is formed on the silicon-germanium layer at a high temperature, germanium atoms may escape from the silicon-germanium layer and then may be moved into the gate insulating layer to be agglutinated. As a result, a plurality of trap sites (e.g., oxygen vacancies) may be formed in the gate insulating layer, thereby causing deterioration of electrical characteristics of a semiconductor device, for example, positive bias temperature instability (PBTI), negative bias temperature instability (NBTI), and time dependent dielectric breakdown (TDDB). According to some embodiments of the present inventive concepts, the insulating layer 31 may be formed at the temperature lower than that of the second insulating layer 32 to reduce deterioration of the electrical characteristics of the semiconductor device. Since the second insulating layer 32 is formed at the higher temperature than the first insulating layer 31, the second insulating layer 32 may include less crystal defects than those of the first insulating layer 31. In some embodiments, the second insulating layer 32 formed at the relatively high temperature may have a density higher than that of the first insulating layer 31 and may have a wet etching rate lower than that of the first insulating layer 31.

The first insulating layer 31 and the second insulating layer 32 may be formed by an in-situ process. In other words, the first insulating layer 31 and the second insulating layer 32 may be continuously formed in the same process chamber. In some embodiments, as illustrated in FIG. 11, the first insulating layer 31 may be formed at the first temperature $T_1$ for a first time t1, and the temperature of the process chamber may rise to the second temperature $T_2$ for a second time t2 after the formation of the first insulating layer 31 is finished. Thereafter, the second insulating layer 32 may be formed at the second temperature $T_2$ for a third time t3.

In some embodiments, as illustrated in FIG. 12, the first insulating layer 31 may be formed at the first temperature $T_1$ for a first time t1 and then the second insulating layer 32 may be formed while the temperature of the process chamber rises to the second temperature $T_2$ for a second time t2. Alternatively, the second insulating layer 32 may be formed for the second time t2 and a third time t3.

In some embodiments, as illustrated in FIG. 13, the first insulating layer 31 and the second insulating layer 32 may be formed separately. A curing process may be performed in order to reduce defects in the first insulating layer 31 formed at the relatively low temperature after the formation of the first insulating layer 31 and before the formation of the second insulating layer 32. In some embodiments, the curing process may be performed using a plasma gas including oxygen or nitrogen.

The formation process of the first and second insulating layers 31 and 32 may include at least one of an ultraviolet (UV)-oxidation process, an O2 plasma oxidation process, an in-situ steam generation (ISSG) process, a thermal oxidation process, an atomic layer deposition (ALD) oxidation process, a wet oxidation process, a chemical vapor deposition (CVD) process, or a physical vapor deposition (PVD) process.

Each of the first and second insulating layers 31 and 32 may include a silicon oxide layer, a silicon oxynitride layer, and/or a high-k dielectric layer having a dielectric constant higher than that of silicon oxide. For example, the high-k dielectric layer may include a hafnium oxide (HfO) layer, an aluminum oxide (AlO) layer, and/or a tantalum oxide (TaO) layer. In some embodiments, the first insulating layer 31 may be a silicon oxide layer, and the second insulating layer 32 may a the high-k dielectric layer.

The first insulating layer 31 may be formed to be thinner than the second insulating layer 32. For example, a thickness of the second insulating layer 32 may be in the range of about 120% to about 400% of a thickness of the first insulating layer 31. For example, the thickness of the first insulating layer 31 may be in the range of about 15 Å to about 40 Å.

Referring to FIGS. 1, 2, 7A, and 7B, the first and second insulating layers 31 and 32 in the cell array region CAR and the second peripheral circuit region PCR2 may be removed. The removal process may be performed by a dry and/or a wet etching process after a mask layer is formed to cover the first peripheral circuit region PCR1.

Thereafter, a third insulating layer 33 and a fourth insulating layer 34 may be sequentially formed on an entire upper surface of the substrate 100. In the second peripheral circuit region PCR2, the third insulating layer 33 may be in contact with the second silicon-germanium channel layer 106. In the first peripheral circuit region PCR1, the third insulating layer 33 may be in contact with the second insulating layer 32.

The third insulating layer 33 may be formed at a lower temperature than the fourth insulating layer 34. In some embodiments, the third insulating layer 33 may be formed at a third temperature $T_3$ lower than the reference temperature $T_L$, and at least a portion of the fourth insulating layer 34 may be formed at a fourth temperature $T_4$ higher than the reference temperature $T_L$. For example, the reference temperature $T_L$ may be about 750° C. Formation temperatures and formation methods of the third and fourth insulating layers 33 and 34 may be described with reference to FIGS. 11 to 13. The third temperature $T_3$ may correspond to the first temperature $T_1$ of FIGS. 11 to 13, and the fourth temperature $T_4$ may correspond to the second temperature $T_2$ of FIGS. 11 to 13. The third temperature $T_3$ and the fourth temperature $T_4$ may be different from the first temperature $T_1$ and the second temperature $T_2$, respectively.

The formation process of the third and fourth insulating layers 33 and 34 may include at least one of an UV-oxidation process, an O2 plasma oxidation process, an in-situ steam generation (ISSG) process, a thermal oxidation process, an ALD oxidation process, a wet oxidation process, a chemical vapor deposition (CVD) process, or a physical vapor deposition (PVD) process.

Each of the third and fourth insulating layers 33 and 34 may include a silicon oxide layer, a silicon oxynitride layer, and/or a high-k dielectric layer having a dielectric constant higher than that of silicon oxide. For example, the high-k dielectric layer may include a hafnium oxide (HfO) layer, an aluminum oxide (AlO) layer, and/or a tantalum oxide (TaO) layer. In some embodiments, the third insulating layer 33 may be a silicon oxide layer, and the fourth insulating layer 34 may be a high-k dielectric layer.

The fourth insulating layer 34 may be formed to be thinner than the third insulating layer 33. For example, a thickness of the fourth insulating layer 34 may be in the range of about 50% to about 90% of a thickness of the third insulating layer 33. For example, the thickness of the fourth insulating layer 34 may be in the range of about 15 Å to about 40 Å. The thickness of the third insulating layer 33 may be less than the thickness of the second insulating layer 32.

Referring to FIGS. 1, 2, 8A, and 8B, the mask layer 112 and the third and fourth insulating layers 33 and 34 in the cell array region CAR may be removed. When the mask layer 112 and the third and fourth insulating layers 33 and 34 are removed, the layers in the first and second peripheral circuit regions PCR1 and PCR2 may be protected by a mask layer.

A bit line structure BL may be formed in the cell array region CAR, a first peripheral transistor PG1 may be formed in the first peripheral circuit region PCR1, and a second peripheral transistor PG2 may be formed in the second peripheral circuit region PCR2. The first and second peripheral transistors PG1 and PG2 may be PMOS transistors. Hereinafter, formation processes of the bit lint structure BL and the first and second peripheral transistors PG1 and PG2 will be described.

After a conductive layer and a capping layer are formed to cover the substrate 100, a patterning process may be performed to form a conductive line 132 and a bit line capping pattern 172 in the cell array region CAR, to form a first gate electrode 133 and a first capping pattern 173 in the first peripheral circuit region PCR1, and to form a second gate electrode 134 and a second capping pattern 174 in the second peripheral circuit region PCR2. The conductive layer may include at least one of a doped semiconductor material, a metal, or a conductive metal nitride. In some embodiments, the conductive layer may include a doped semiconductor layer, a metal layer, and a metal-silicide layer between the doped semiconductor layer and the metal layer. The capping layer may include at least one of a silicon oxide layer, a silicon nitride layer, or a silicon oxynitride layer. Each of the conductive layer and the capping layer may be formed by at least one of a CVD process, a PVD process, or an ALD process.

When the patterning process is performed, the first to fourth insulating layers 31 to 34 may also be patterned to form a first gate insulating layer GL1 under the first gate electrode 133 and a second gate insulating layer GL2 under the second gate electrode 134. A first spacer SP1, a second spacer SP2, and a third spacer SP3 may be formed on sidewalls of the conductive line 132, the first gate electrode 133, and the second gate electrode 134, respectively. A formation process of the first to third spacers SP1 to SP3 may include a deposition process of an insulating layer and an anisotropic etching process. For example, the first to third spacers SP1 to SP3 may include silicon oxide, silicon nitride, and/or silicon oxynitride.

Each of the first and second gate insulating layers GL1 and GL2 may include a second low-temperature insulating pattern LT2 and a second high-temperature insulating pattern HT2. The second low-temperature insulating pattern LT2 and the second high-temperature insulating pattern HT2 may be formed from the third insulating layer 33 and the fourth insulating layer 34, respectively. The first gate insulating layer GL1 may further include a first low-temperature insulating pattern LT1 and a first high-temperature insulating pattern HT1. The first low-temperature insulating pattern LT1 may be disposed between the second low-temperature pattern LT2 and the first silicon-germanium channel layer 105, and the first high-temperature insulating pattern HT2 may be disposed between the first low-temperature insulating pattern LT1 and the second low-temperature insulating pattern LT2. The first low-temperature insulating pattern LT1 and the first high-temperature insulating pattern HT2 may be formed from the first insulating layer 31 and the second insulating layer 32, respectively.

First source/drain regions 23 may be formed in the substrate 100 in the first peripheral circuit region PCR1, and second source/drain regions 24 may be formed in the substrate 100 in the second peripheral circuit region PCR2. The first and second source/drain regions 23 and 24 may be formed by an ion implantation process. During the formation of the first and second source/drain regions 23 and 24, the cell array region CAR may be covered by a mask, or an additional ion implantation process may be performed on the second dopant regions 22.

Referring to FIGS. 1, 2, 9A, and 9B, after a first interlayer insulating layer 116 is formed to cover the entire top surface of the substrate 100, contacts 181 may be formed to penetrate the first interlayer insulating layer 116. The contacts 181 may be connected to the second dopant regions 22, respectively. The first interlayer insulating layer 116 may include a silicon oxide layer. The contacts 181 may include a doped semiconductor, a metal, and/or a conductive metal nitride.

If the semiconductor device according to some embodiments of the present inventive concepts is a dynamic random access memory (DRAM) device, capacitors may be provided to be electrically connected to the second dopant regions 22. In some embodiments, a second interlayer insulating layer 117 may be formed on the first interlayer insulating layer 116 and then lower electrodes 182 may be formed to penetrate the second interlayer insulating layer 117 and to be connected to the contacts 181. In some embodiments, each of the lower electrodes 182 may have a cylindrical shape of which a bottom is closed. A capacitor dielectric layer 183 and an upper electrode 184 may be sequentially formed on the lower electrodes 182. The lower electrodes 182 and the upper electrode 184 may include at least one of a doped semiconductor, a metal, or a conductive metal nitride. The capacitor dielectric layer 183 may include silicon oxide. The lower electrodes 182, the upper electrode 184 and the capacitor insulating layer 183 may be formed using at least one of a CVD process, a PVD process, or an ALD process.

The semiconductor device according to some embodiments of the present inventive concepts will be described with reference to FIGS. 1, 2, 9A, and 9B. The semiconductor device according to some embodiments may include a substrate 100 including a cell array region CAR and a peripheral circuit region. The peripheral circuit region may include a first peripheral circuit region PCR1 and a second peripheral circuit region PCR2. Cell gate structures may be provided to be disposed in the substrate 100 of the cell array region CAR. The cell gate structure may include a cell gate insulating pattern 121, a cell gate electrode 126, and a gate capping pattern 129 that are sequentially stacked in a trench 11 formed in the substrate 100. The cell gate structures may be word lines WL of the semiconductor device.

A first dopant region 21 and second dopant regions 22 may be provided in an active region defined by a device isolation layer 101 and the word lines WL. The first dopant region 21 may be provided between a pair of second dopant regions 22. The first dopant region 21 and the second dopant regions 22 may be separated from each other by the trenches 11. The second dopant regions 22 may be connected to capacitors through contacts 181. The capacitors may include lower electrodes 182, an upper electrode 184, and a capacitor dielectric layer 183 disposed between the upper electrode 184 and the lower electrodes 182.

A bit line structure BL may be provided on the word lines WL. The bit line structure BL may include a conductive line 132 connected to the first dopant region 21, a bit line capping pattern 172 on the conductive line 132, and a first spacer SP1 on a sidewall of the conductive line 132.

A first peripheral transistor PG1 may be provided in the first peripheral circuit region PCR1, and a second peripheral transistor PG2 may be provided in the second peripheral circuit region PCR2. The first and second peripheral transistors PG1 and PG2 may be PMOS transistors. The first peripheral transistor PG1 may include a first silicon-germanium channel layer 105, a first gate insulating layer GL1, a first gate electrode 133, and a first capping pattern 173. The first gate insulating layer GL1, the first gate electrode 133, and the first capping pattern 173 may be sequentially stacked on the first silicon-germanium channel layer 105. The second peripheral transistor PG2 may include a second silicon-germanium channel layer 106, a second gate insulating layer GL2, a second gate electrode 134, and a second capping pattern 174. The second gate insulating layer GL2, the second gate electrode 134, and the second capping pattern 174 may be sequentially stacked on the second silicon-germanium channel layer 106.

The conductive line 132, the first gate electrode 133, and the second gate electrode 134 may include the same layer. For example, each of the conductive line 132 and the first and second gate electrodes 133 and 134 may include at least one of a doped semiconductor layer, a metal layer, or a conductive metal nitride layer.

Each of the first and second gate insulating layers GL1 and GL2 may include a second low-temperature insulating pattern LT2 and a second high-temperature insulating pattern HT2. The first gate insulating layer GL1 may further include a first low-temperature insulating pattern LT1 between the second low-temperature insulating pattern LT2 and the first silicon-germanium channel layer 105, and a first high-temperature insulating pattern HT1 between the first low-temperature insulating pattern LT1 and the second low-temperature insulating pattern LT2. The first low-temperature insulating pattern LT1 may be thinner than the first high-temperature insulating pattern HT1. The second low-temperature insulating pattern LT2 may be thicker than the second high-temperature insulating pattern HT2.

According to some embodiments of the present inventive concepts, the low-temperature insulating patterns LT1 and LT2 contacting the first and second silicon-germanium channel layers 105 and 106 may be formed at a relatively low temperature, and the high-temperature insulating patterns HT1 and HT2 thereon may be formed at a relatively high temperature. As a result, it is possible to reduce deterioration of portion of the gate insulating layer which contacts the silicon-germanium channel layer. Additionally, crystal defects of an entire gate insulating layer may be reduced.

Figure 10:
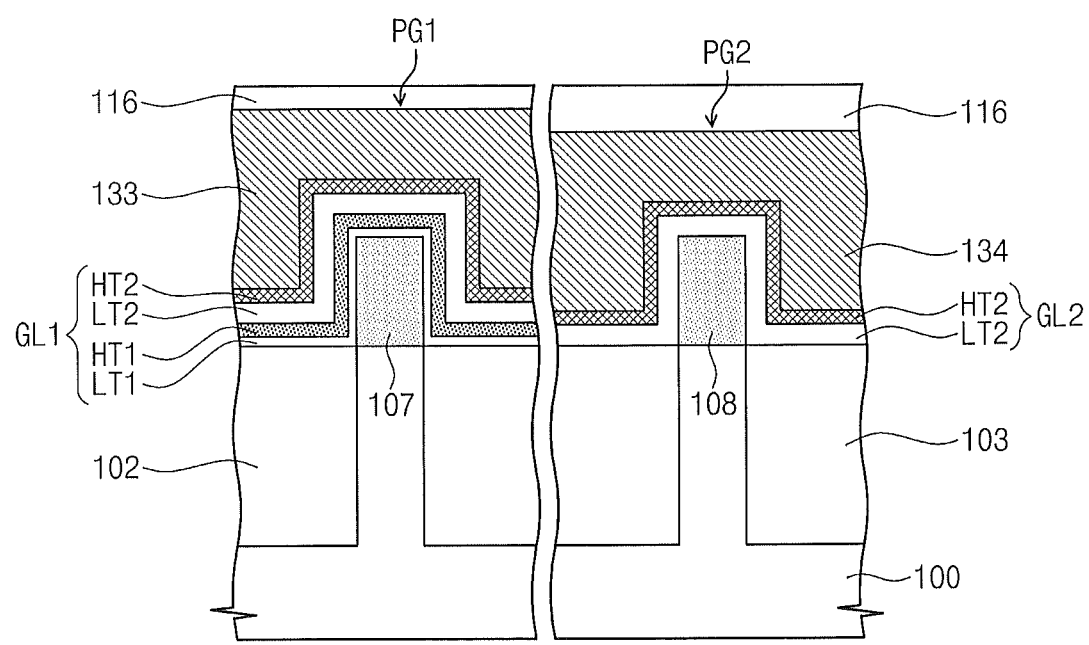
FIG. 10 provides sectional views taken along lines, which are substantially perpendicular to the line B-B' and the line C-C' of FIG. 1, respectively, illustrating a semiconductor device according to some embodiments of the present inventive concepts.

FIG. 10 provides sectional views taken along lines, which are substantially perpendicular to the line B-B' and the line C-C' of FIG. 1, respectively, illustrating a semiconductor device according to some embodiments of the present inventive concepts. In some embodiments, the first peripheral transistor PG1 and the second peripheral transistor PG2 may include a first silicon-germanium channel layer 107 and a second silicon-germanium channel layer 108, respectively. The first and second silicon-germanium channel layer 107 and 108 may have fin-shapes protruding from the substrate 100. In some embodiments, the first and second silicon-germanium channel layers 107 and 108 may be grown from the substrate 100 exposed by device isolation layers 102 and 103 by an epitaxial process.

The semiconductor devices according to the present inventive concepts are not limited to the DRAM device. The semiconductor devices according to the present inventive concepts may include magnetic random access memory (MRAM) devices, phase change random access memory (PRAM) devices, ferroelectric random access memory (FRAM) devices, and/or resistive random access memory (RRAM) devices. In some embodiments, if the semiconductor device is the MRAM device, a magnetic tunnel junction (MTJ) including a reference layer, a tunnel barrier, and a free layer instead of the capacitor may be provided in the semiconductor device. In some embodiments, if the semiconductor device is the PRAM device, a lower electrode, an upper electrode, and a phase change material layer between the lower and upper electrodes may be provided instead of the capacitor.

The semiconductor devices in the embodiments described above may be encapsulated using various packaging techniques. For example, the semiconductor devices according to some embodiments may be encapsulated using any one of a package on package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor device according to some embodiments is mounted may further include at least one semiconductor device (e.g., a controller and/or a logic device) that controls the semiconductor device.

Figure 14:
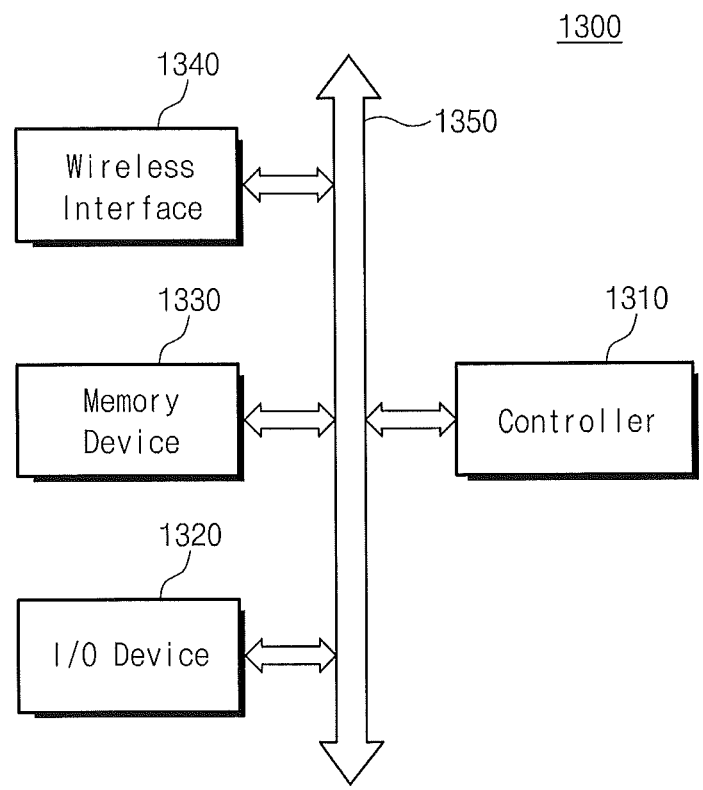
FIG. 14 is a schematic block diagram illustrating an electronic device including a semiconductor device according to some embodiments of the present inventive concepts.

FIG. 14 is a schematic block diagram illustrating an electronic device including a semiconductor device according to some embodiments of the present inventive concepts. Referring to FIG. 14, an electronic device 1300 according to some embodiments of the present inventive concepts may be one of a personal digital assistant (PDA), a laptop computer, a portable computer, a web tablet, a wireless phone, a mobile phone, a digital music player, a cable/wireless electronic device, and any complex electronic device including at least two thereof. The electronic device 1300 may include a controller 1310, an input/output (I/O) device 1320 (e.g., a keypad, a keyboard and/or a display), a memory device 1330, and a wireless interface unit 1340, which are combined with each other through a data bus 1350. For example, the controller 1310 may include at least one of a microprocessor, a digital signal processor, a microcontroller or other logic devices. The other logic devices may have a similar function to any one of the microprocessor, the digital signal processor and the microcontroller. The memory device 1330 may store, for example, commands performed by the controller 1310. Additionally, the memory device 1330 may also be used for storing a user data. The memory device 1330 includes at least one of the semiconductor devices according to some embodiments of the present inventive concepts. The electronic device 1300 may use the wireless interface unit 1340 in order to transmit data to a wireless communication network communicating with a radio frequency (RF) signal or in order to receive data from the network. For example, the wireless interface unit 1340 may include an antenna or a wireless transceiver. The electronic device 1300 may be used in a communication interface protocol such as a third generation communication system (e.g., CDMA, GSM, NADC, E-TDMA, WCDAM, and/or CDMA2000).

Figure 15:
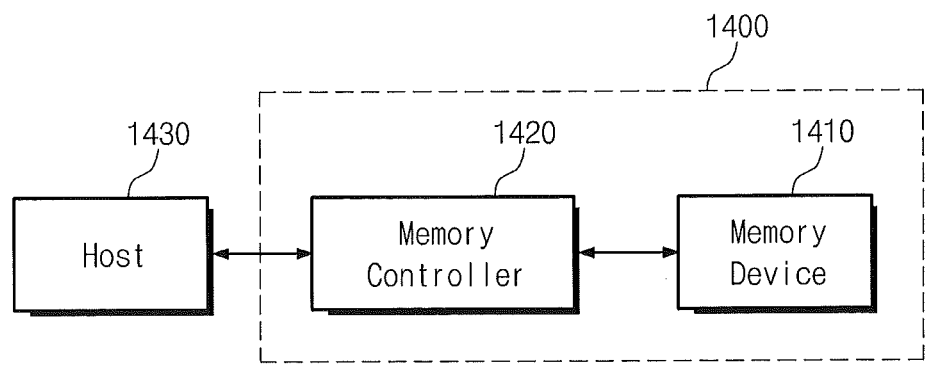
FIG. 15 is a schematic block diagram illustrating a memory system including a semiconductor device according to some embodiments of the present inventive concepts.

FIG. 15 is a schematic block diagram illustrating a memory system including a semiconductor device according to some embodiments of the present inventive concepts. Referring to FIG. 15, the semiconductor device according to some embodiments of the present inventive concepts may be used in order to realize a memory system. A memory system 1400 may include a memory device 1410 for storing massive data and a memory controller 1420. The memory controller 1420 may read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include the semiconductor device according to some embodiments of the present inventive concepts.

According to some embodiments of the present inventive concepts, it is possible to reduce deterioration of the electrical characteristics of the semiconductor device caused by the germanium atoms escaping from the silicon-germanium channel layer.

The above-disclosed subject matter is to be considered illustrative, and not restrictive, and the appended claims are intended to cover all such modifications, enhancements, and other embodiments, which fall within the true spirit and scope of the present inventive concepts. Thus, to the maximum extent allowed by law, the scopes of the present inventive concepts are to be determined by the broadest permissible interpretation of the following claims and their equivalents, and shall not be restricted or limited by the foregoing description.

What is claimed is:

1. A method of forming a semiconductor memory device, the method comprising:
   forming a silicon-germanium channel layer on a substrate in a peripheral circuit region, wherein the substrate includes a cell array region and the peripheral circuit region;
   sequentially forming a first insulating layer and a second insulating layer on the silicon-germanium channel layer;
   removing the first and second insulating layers from the cell array region;
   forming a conductive layer on the substrate in the cell array region and the peripheral circuit region after removing the first and second insulating layers; and
   patterning the conductive layer to form a conductive line in the cell array region and a gate electrode in the peripheral circuit region,
   wherein sequentially forming the first and second insulating layers comprises forming the first insulating layer at a first temperature and forming the second insulating layer at a second temperature higher than the first temperature.

2. The method of claim 1, wherein the first temperature is lower than 750° C, and the second temperature is higher than 750° C.

3. The method of claim 1, wherein the first insulating layer has a first thickness thinner than a second thickness of the second insulating layer.

4. The method of claim 1, wherein:
   the peripheral circuit region includes a first peripheral circuit region and a second peripheral circuit region; and
   the method further comprises:
   removing the first and second insulating layers from the second peripheral circuit region without removing the first and second insulating layers from the first peripheral circuit region; and
   sequentially forming a third insulating layer and a fourth insulating layer on the substrate in the first and second peripheral circuit regions after removing the first and second insulating layers from the second peripheral circuit region without removing the first and second insulating layers from the first peripheral circuit region.

5. The method of claim 4, wherein sequentially forming the third and fourth insulating layers comprises forming the third insulating layer at a third temperature and forming the fourth insulating layer at a fourth temperature higher than the third temperature.

6. The method of claim 4, wherein the fourth insulating layer includes a high-k dielectric layer having a dielectric constant greater than a dielectric constant of silicon oxide.

7. The method of claim 4, wherein the third insulating layer has a third thickness thicker than a fourth thickness of the fourth insulating layer.

8. The method of claim 1, wherein sequentially forming the first and second insulating layers comprises forming the second insulating layer by increasing a temperature from the first temperature to the second temperature.

9. A method of forming a semiconductor device, the method comprising:
   forming a silicon-germanium channel layer on a substrate in a peripheral circuit region, wherein the substrate comprises a cell array region and the peripheral circuit region;
   sequentially forming a first insulating layer at a first temperature and a second insulating layer at a second temperature higher than the first temperature on the silicon-germanium channel layer, wherein the first insulating layer contacts the silicon-germanium channel layer;
   removing the first and second insulating layers from the cell array region;
   forming a conductive layer on the substrate in the cell array region and the peripheral circuit region after removing the first and second insulating layers from the cell array region; and
   forming a bit line in the cell array region and a gate electrode in the peripheral circuit region by patterning the conductive layer.

10. The method of claim 9, wherein the first temperature is lower than 750° C., and the second temperature is higher than 750° C.

11. The method of claim 10, wherein the first temperature is in a range of about 400° C. to about 700° C.

12. The method of claim 9, wherein:
   the first insulating layer comprises a silicon oxide layer; and
   the second insulating layer comprises a high-k dielectric layer having a dielectric constant higher than a dielectric constant of silicon oxide.

13. The method of claim 9, wherein the first insulating layer has a first thickness thinner than a second thickness of the second insulating layer.

14. The method of claim 9, wherein the bit line contacts an upper surface of the substrate.

15. The method of claim 14, further comprising forming a buried word line structure in the cell array region before forming the silicon-germanium channel layer.

16. The method of claim 9, wherein:
   the peripheral circuit region comprises a first peripheral circuit region and a second peripheral circuit region;
   the gate electrode comprises a first gate electrode formed in the first peripheral circuit region; and
   the method further comprises:
   removing the first and second insulating layers from the second peripheral circuit region at least partially concurrently with removing the first and second insulating layers from the cell array region;
   sequentially forming a third insulating layer and a fourth insulating layer in the first and second peripheral circuit regions after removing the first and second insulating layers from the second peripheral circuit region and before forming the conductive layer, wherein sequentially forming the third and fourth insulating layers comprises forming the third insulating layer at a third temperature and forming the fourth insulating layer at a fourth temperature higher than the third temperature; and forming a second gate electrode in the second peripheral circuit region by patterning the conductive layer.

17. The method of claim 16, wherein the third temperature is lower than 750° C., and the fourth temperature is higher than 750° C.

18. The method of claim 17, wherein the third insulating layer has a third thickness thicker than a fourth thickness of the fourth insulating layer.

19. A method of forming a semiconductor device, the method comprising:

forming a silicon-germanium channel layer on a substrate in a first peripheral circuit region and a second peripheral circuit region, wherein the substrate comprises a cell array region and the first and second peripheral circuit regions;

sequentially forming a first insulating layer at a first temperature and a second insulating layer at a second temperature higher than the first temperature on the silicon-germanium channel layer, wherein the first insulating layer contacts the silicon-germanium channel layer;

removing the first and second insulating layers from the cell array region and the second peripheral circuit region without removing the first and second insulating layers from the first peripheral circuit region;

sequentially forming a third insulating layer and a fourth insulating layer on the silicon-germanium channel layer after removing the first and second insulating layers from the cell array region and the second peripheral circuit region without removing the first and second insulating layers from the first peripheral circuit region, wherein sequentially forming the third and fourth insulating layers comprises forming the third insulating layer at a third temperature and forming the fourth insulating layer at a fourth temperature higher than the third temperature, and the third insulating layer formed in the second peripheral circuit region contacts the silicon-germanium channel layer;

forming a conductive layer on the substrate in the cell array region and the first and second peripheral circuit regions; and forming a bit line in the cell array region, and first and second gate electrodes in the first and second peripheral circuit regions, respectively, by patterning the conductive layer.

20. The method of claim 19, wherein the first and third temperatures are lower than 750° C., and the second and fourth temperatures are higher than 750° C.

* * * * *